US007142454B2

(12) United States Patent
Yang et al.

(10) Patent No.: US 7,142,454 B2
(45) Date of Patent: Nov. 28, 2006

(54) SYSTEM AND METHOD FOR Y-DECODING IN A FLASH MEMORY DEVICE

(75) Inventors: Tien-Chun Yang, San Jose, CA (US); Ming-Huei Shieh, Cupertino, CA (US); Kurihara Kazuhiro, Sunnyvale, CA (US); Pau-Ling Chen, Saratoga, CA (US)

(73) Assignee: Spansion, LLC, Sunnyvale, CA (US)

( * ) Notice: Subject to any disclaimer, the term of this patent is extended or adjusted under 35 U.S.C. 154(b) by 83 days.

(21) Appl. No.: 10/243,315

(22) Filed: Sep. 12, 2002

(65) Prior Publication Data

US 2004/0052111 A1 Mar. 18, 2004

(51) Int. Cl.
*G11C 16/04* (2006.01)

(52) U.S. Cl. .......................... 365/185.18; 365/185.02; 365/185.03; 365/185.21; 365/185.26

(58) Field of Classification Search .......... 365/185.18, 365/185.02, 185.21, 185.26, 185.03
See application file for complete search history.

(56) References Cited

U.S. PATENT DOCUMENTS

| 5,128,895 | A | * | 7/1992 | Park ...................... 365/185.02 |
| 5,986,934 | A | | 11/1999 | Kao et al. ............... 365/185.18 |
| 6,044,033 | A | * | 3/2000 | Jang ...................... 365/230.03 |
| 6,438,035 | B1 | * | 8/2002 | Yamamoto et al. .... 365/185.21 |
| 6,709,920 | B1 | * | 3/2004 | Boo et al. ................... 438/257 |

FOREIGN PATENT DOCUMENTS

| EP | 1262995 A1 | 4/2002 |
| EP | 1298671 A2 | 2/2003 |
| GB | 2272089 A | 4/1994 |

OTHER PUBLICATIONS

XP 000557809, S.C. Tsao, J.E. Frayer, C.S. Pang and Yale Ma / Bright Microelectronics Inc., Santa Clara, CA. 95054, USA, K. Kwon, Y. Choi, D. Kim, J. Kim, and J. Park / Hyundai Electronics Industries Co. Ltd., Ichon-Kun, Korea, Titled: A 5V-Only 16M Flash Memory Using a Contactless Array of Source-Side Injection Cells, 1995 Symposium on VLSI Circuits Digest of Technical Papers.

XP 000694045, Yoshimitsu Yamauchi, Keizo Sakiyama / VLSI Development LABs Sharp Corporation, Ichinomoto-cho, Tenri-shi, Nara 632, Japan, Titled: A Novel NOR Virtual-Ground Array Architecture for High Density Flash, Extended Abstracts of the 1996 International Conference on Solid State Devices and Materials, Yokohama, 1996, pp. 269-271.

* cited by examiner

*Primary Examiner*—Hoai V. Ho

(57) ABSTRACT

A system and method for column selection in a non-volatile memory cell array is disclosed. A group of memory cells is arranged in a rectangular array having rows (X-dimension) and columns (Y-dimension). Within a row, the sources and drains of the memory cells are connected to form a linear chain. A common word line is coupled to each gate in the row. A separate column line is coupled to each node between adjacent memory cells of the chain. A four column Y-decoder is used to select column lines for sense operations. A voltage source is applied to two of the four column lines during the sense operation. Current on one of the column lines may be sensed to provide a measurement for read or verification.

10 Claims, 12 Drawing Sheets

SYSTEM AND METHOD FOR Y-DECODING IN A FLASH MEMORY DEVICE

TECHNICAL FIELD

The present invention relates to a non-volatile memory. Specifically, the present invention relates to a method for Y-decoding and column selection in a non-volatile-memory device.

BACKGROUND ART

Many electronic devices, such as computers, personal digital assistants, cellular telephones, digital cameras and similar systems and devices include processors and memory. The memory is used to store computer programs to be executed by the device and/or data operated on by the processors to achieve the functionality of the device. Many devices and systems require that this information be retained in permanent storage/non-volatile medium so that the data and computer programs is not lost when power is removed.

Flash memory (or Flash RAM) is an example of a non-volatile memory device. Flash memory devices use a memory cell transistor with a floating gate structure. The typical memory cell in a flash memory device comprises an access transistor and a storage element, such as a floating gate. Data in the flash memory device are programmed or erased by accumulation or depletion of charge, respectively, on a thin insulating film between a substrate and a floating gate. Programming of the memory cells occurs by applying a sufficient voltage difference to the transistors to cause excess electrons to accumulate on the floating gate. The accumulation of the additional electrons on the floating gate raises the charge on the gate and the transistor's threshold voltage. The transistor's threshold voltage is raised sufficiently above that of the applied voltage during read cycles so that the transistor does not turn on during the read cycles. Therefore, a programmed memory cell will not carry current, representing the logical value "0." The erasure of a sector of data is caused by a process in which a voltage difference is applied to the transistor in each memory cell of the sector to cause the excess electrons on the floating gate in each transistor to evacuate the film. Thereby the transistor's threshold voltage is lowered below that of the voltage potential applied to the transistor to read data. In the erased state, current will flow through the transistor. When the read voltage potential is applied, the current will flow through the transistor of the memory cell, representing a logical value "1" stored in the memory cell.

Memory cells are typically used as arrays that may be configured into units such as blocks, pages, and sectors. memory cells may be connected in a parallel fashion as in a NOR array architecture, or they be connected serially as in a NAND array architecture. Regardless of the memory cell interconnect scheme and array layout used, the basic processes of reading and verifying typically involve setting a source line to ground and applying a drain voltage. In either case, there are parasitic resistances and capacitances that contribute to error currents that degrade the current sensing operation.

With the advent of multi-bit memory cells, the threshold voltage range that was typically used to distinguish between a "0" and a "1" has been subdivided into smaller ranges that are assigned multi-bit logical values. For example, a voltage range of 0.00 to 1.00 volts may be used to store a single bit by assigning "1" to 0 volts and "0" to 1 volts. Alternatively, the range of 0.00 to 1.00 may be divided into four ranges: 0–0.25, 0.25–0.50, 0.50–0.075, and 0.75–1.00. These four ranges would be associated with the logical values "11", "10", "01", and "00".

Although multi-bit memory cells provide an increase in information storage capacity, they also increase the accuracy required of the measurements that are used to distinguish between the logical values associated with the state of the memory cell. The conventional approach of applying a single potential between drain and source does not provide immunity to the parasitic resistances and capacitances associated with a non-volatile memory device.

DISCLOSURE OF THE INVENTION

A system and method for column selection in a non-volatile memory cell array is disclosed. A group of memory cells is arranged in a rectangular array having rows (X-dimension) and columns (Y-dimension). Within a row, the sources and drains of the memory cells are coupled to form a linear chain. A common word line is coupled to each gate in the row. A separate column line is coupled to each node between adjacent memory cells of the chain. A four column Y-decoder is used to select column lines for sense operations. A voltage source is applied to two of the four column lines during the sense operation. Current on one of the column lines may be sensed to provide a measurement for read or verification.

In an embodiment of the present invention, a read operation is performed by a four column Y-decoder. A first column line adjacent to a memory that is to be read is selected and coupled to ground. The second column line adjacent to the memory cell is selected and coupled to a first voltage source. A third column line adjacent to the second column line is selected and coupled to a second voltage source. A fourth column line adjacent to the third column line selected and allowed to float. The voltage level of the first and second voltage sources is substantially the same, allowing the second voltage source to effectively screen the first voltage source from parasitic resistances, and in particular, parasitic capacitances in the memory array.

In a further embodiment, a verify operation is performed by a four column Y-decoder. A first column line adjacent to a memory that is to be read is selected and coupled to ground. The second column line adjacent to the memory cell is selected and coupled to a first voltage source. A third column line adjacent to the second column line is selected and allowed to float. A fourth column line adjacent to the third column line selected and coupled to a second voltage source. The voltage level of the first and second voltage sources is substantially the same, allowing the second voltage source to effectively screen the first voltage source from parasitic resistances while minimizing the impact of the difference between the first and second voltages.

BEST MODES FOR CARRYING OUT THE INVENTION

Reference will now be made in detail to the preferred embodiments of the present invention, a system and method for four column Y-decoding in a flash memory device. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1A:
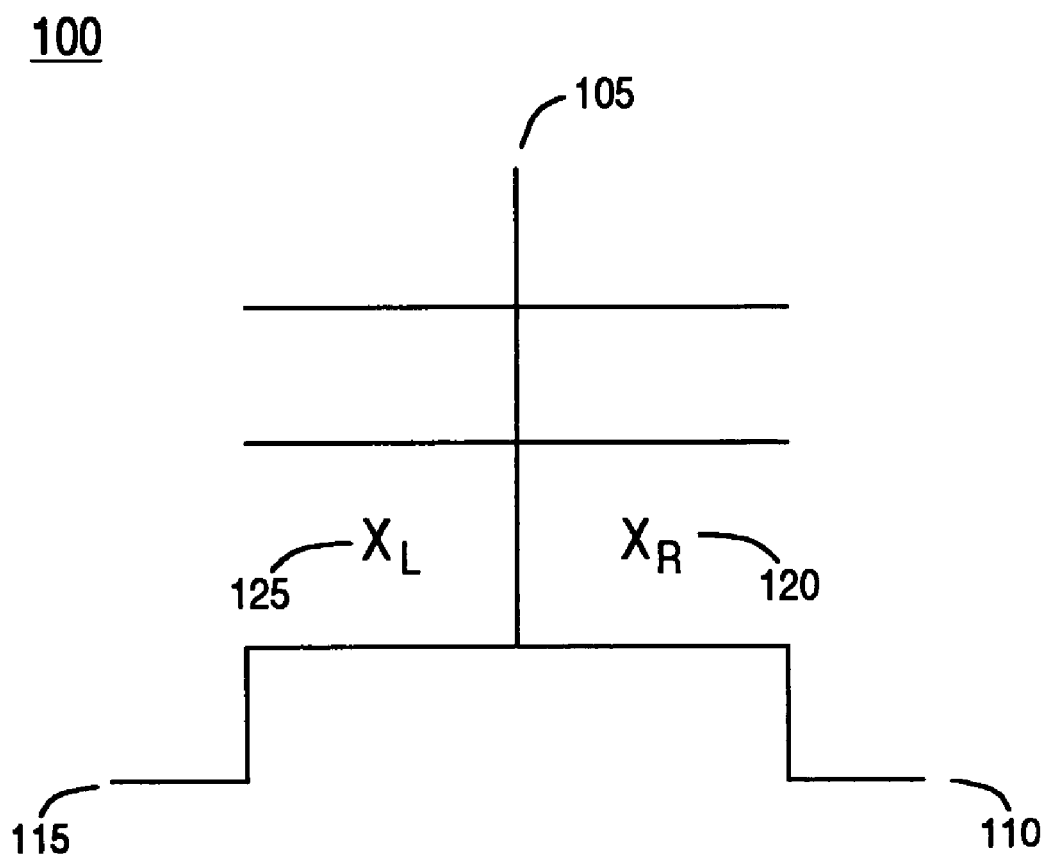
FIG. 1A shows a schematic of a multi-bit memory cell.

FIG. 1A shows a schematic of a multi-bit memory cell 100 having a gate 105, source 115, and a drain 110. The memory cell stores a left bit 125 ($X_L$) and a right bit 120 ($X_R$). In sensing the state of the bits in the memory cell, the source 115 is coupled to ground and a voltage source is applied to the drain 110, while a voltage is applied to the gate 105.

In one embodiment, the cells have a uniform symmetric structure. In one embodiment, the term "uniform symmetric structure" as used herein refers to the structural similarity of the cells in multi-bit memory cell 100 and the balanced left and right side bit storage capacity of these cells.

Figure 1B:
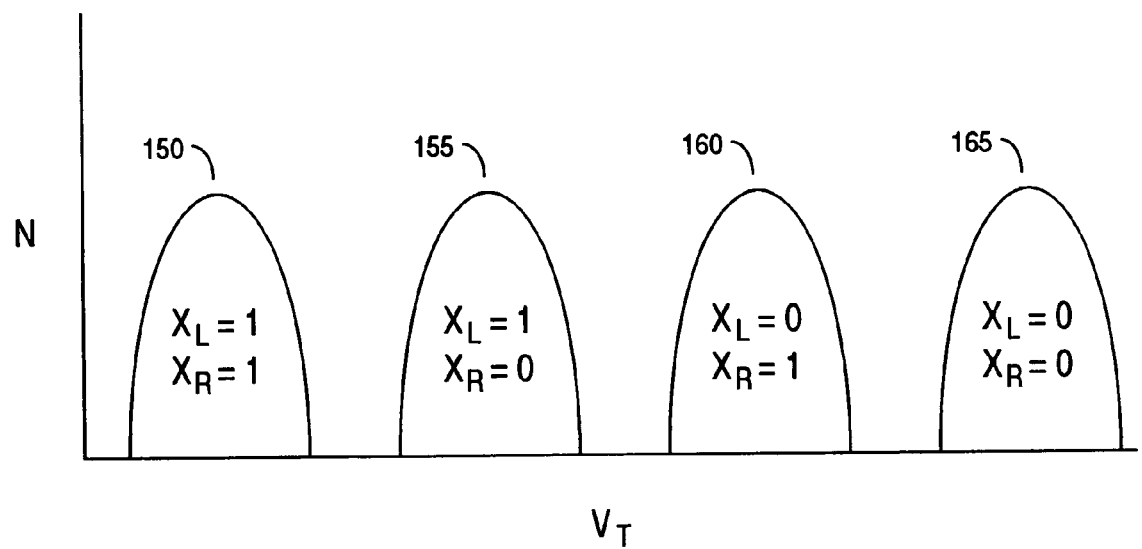
FIG. 1B shows a threshold voltage distribution associated with the logic states of the multi-bit memory cell of FIG. 1A.

FIG. 1B shows schematic threshold voltage distributions 150, 155, 160, and 165 associated with the logic states "11", "10", "01", and "11", respectively, of the multi-bit memory cell 100 of FIG. 1A. The X-axis ($V_1$) represents the threshold voltage and the Y-axis (N) represents the number of memory cells having a particular threshold voltage. In a multi-bit memory cell, the increased number of partitions applied to the operating voltage range increase the requirement for sensing accuracy in order to distinguish between logic states of the cell.

Figure 2A:
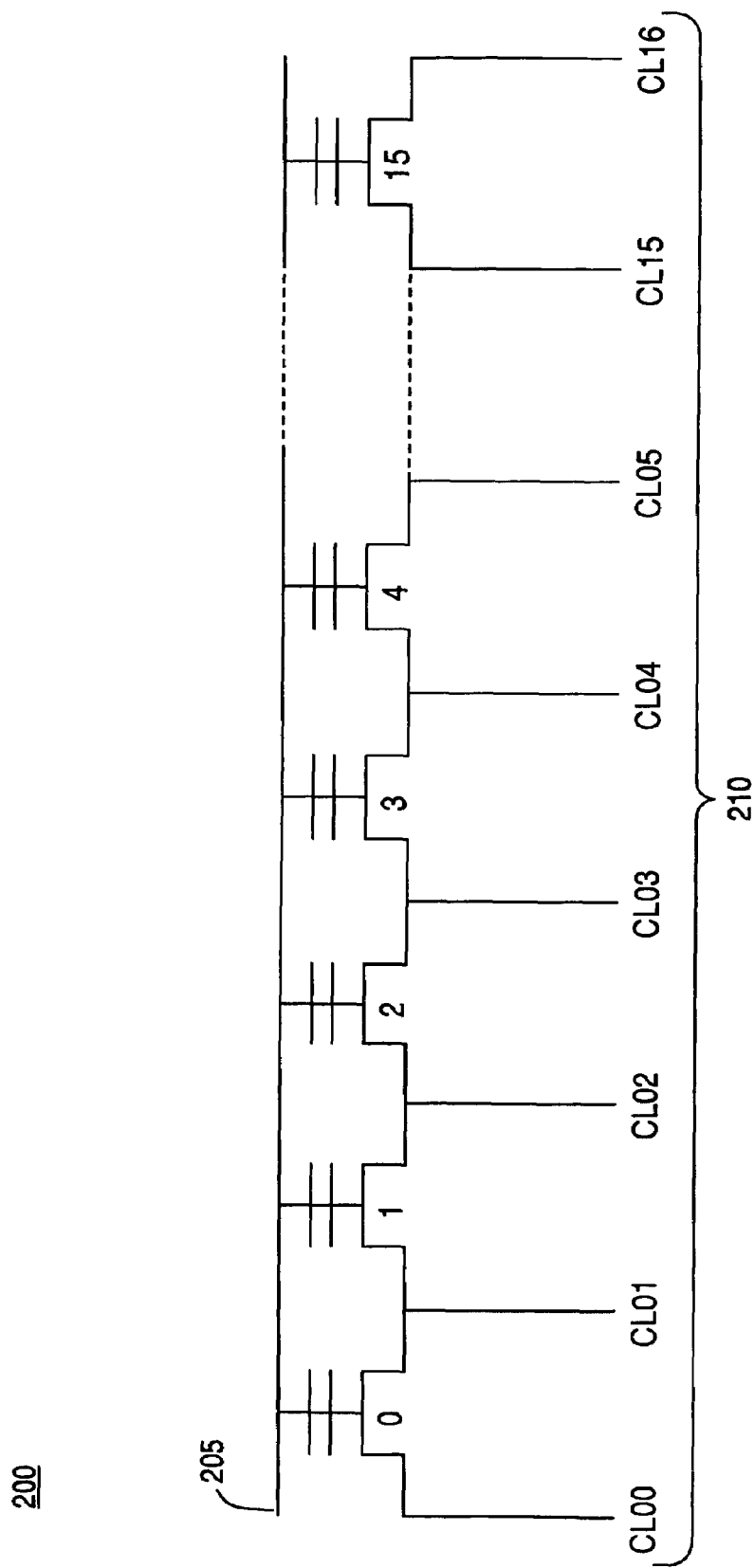
FIG. 2A shows a drain-source series of memory cells with column lines in accordance with an embodiment of the present claimed invention.

FIG. 2A shows a drain-source series 210 having 16 memory cells (0–15) and 17 column lines (CL00–CL16). The gates of the memory cells in the series are connected to a common word line 205. The drain of each memory cell is connected to the source of one of its adjacent memory cells, and source of each memory cell is connected to the drain of the other of its adjacent memory cells. The drain-source series is a portion of a row of memory cells in an array that typically has dummy memory cells (not shown) that are used to provide proper loading at the start and end of a row, but are not accessed for storage. Column lines CL00–CL16 are each coupled to a drain-source node between adjacent memory cells.

Figure 2B:
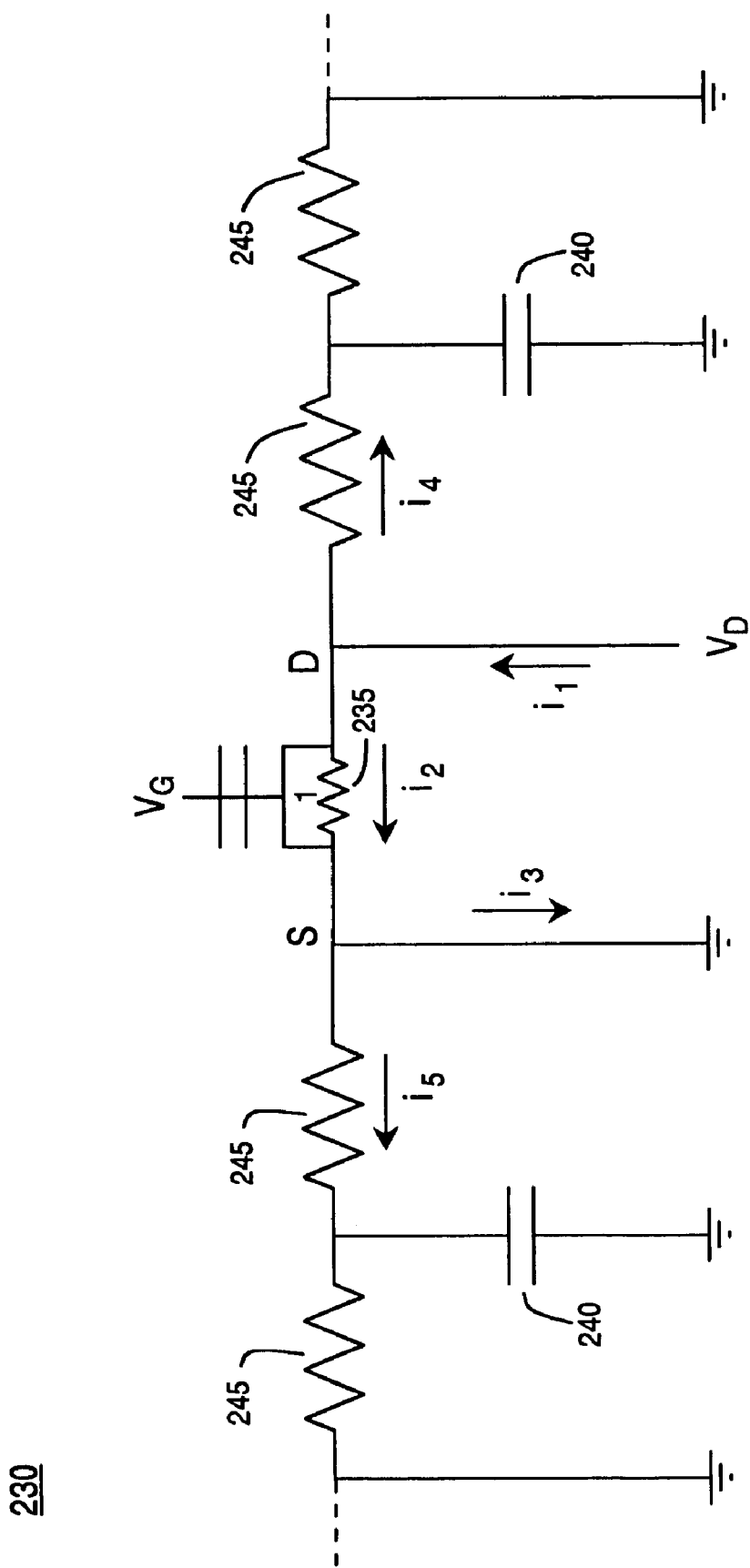
FIG. 2B shows an equivalent circuit representation of the parasitic capacitances and resistances associated with the sense operation of a memory cell in a drain-source series.

FIG. 2B shows an equivalent circuit representation of the parasitic capacitances and resistances associated with the sense operation of a memory cell in the drain-source series 210 of FIG. 2A. In this example, memory cell 1 has its source coupled to ground and a voltage $V_D$ applied to its drain. The adjacent memory cells in the drain-source series present an RC network that is dependent upon the state of the adjacent memory cells and the physical structure of the memory cells and their interconnects. Shunt capacitances 240 and series resistances 245 are shown. In practice, there will be finite values for shunt resistance and series capacitance as well. The memory cell being sensed also has a resistance 235.

In order to determine the state of cell 1 current $i_2$ must be sensed. This is typically done by sensing the current $i_1$ provided by the voltage source $V_D$. As can be seen from FIG. 2B, the parasitic resistances and capacitances result in error currents $i_4$ and $i_5$. The error currents may be transient currents associated with the charging of capacitances, or they may be steady state currents associated with resistances. In general, $i_4$ is of greater concern than $i_5$ since the grounded source S has a very small path resistance in comparison to the current path for $i_5$.

Figure 3A:
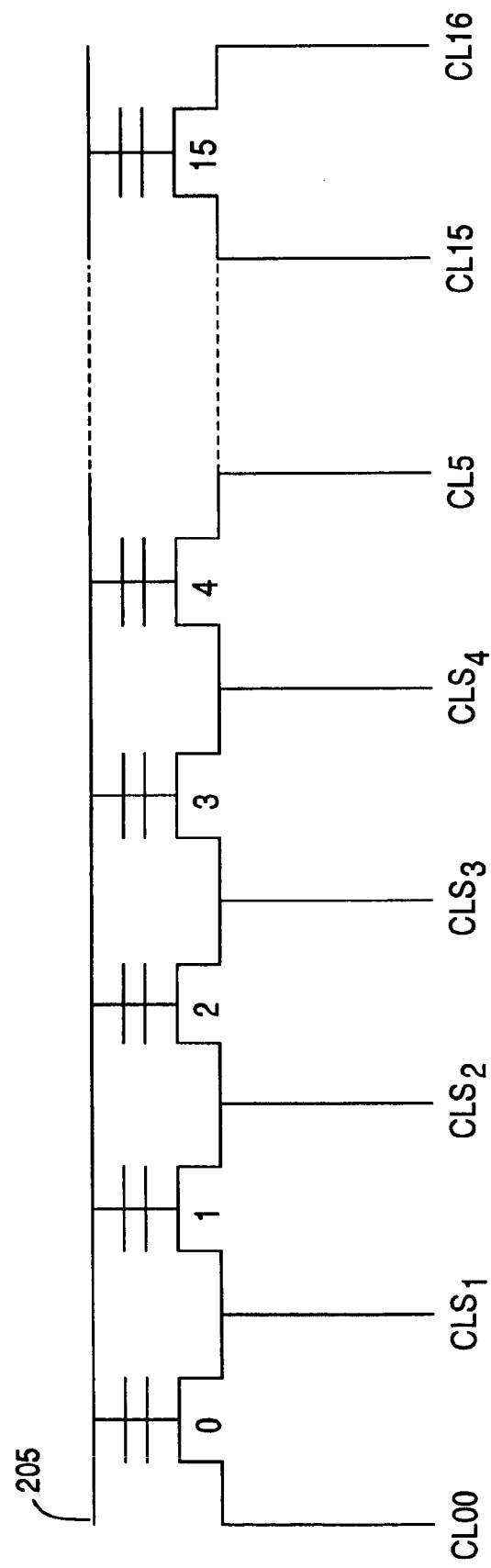
FIG. 3A shows a four column selection for a sense operation in accordance with an embodiment of the present claimed invention.

FIG. 3A shows a four column selection for a sense operation on memory cell 1 in accordance with an embodiment of the present claimed invention. For either a read or verify operation on memory cell 1, the two column lines adjacent to memory cell 1 are selected ($CLS_1$, $CLS_2$) as well as two additional columns ($CLS_3$, $CLS_4$). $CLS_1$ and $CLS_2$ are used to provide the basic sensing current for memory cell 1, and $CLS_3$ and $CLS_4$ are used in conjunction with a voltage source to reduce the error current $i_4$ of FIG. 2B.

Figure 3B:
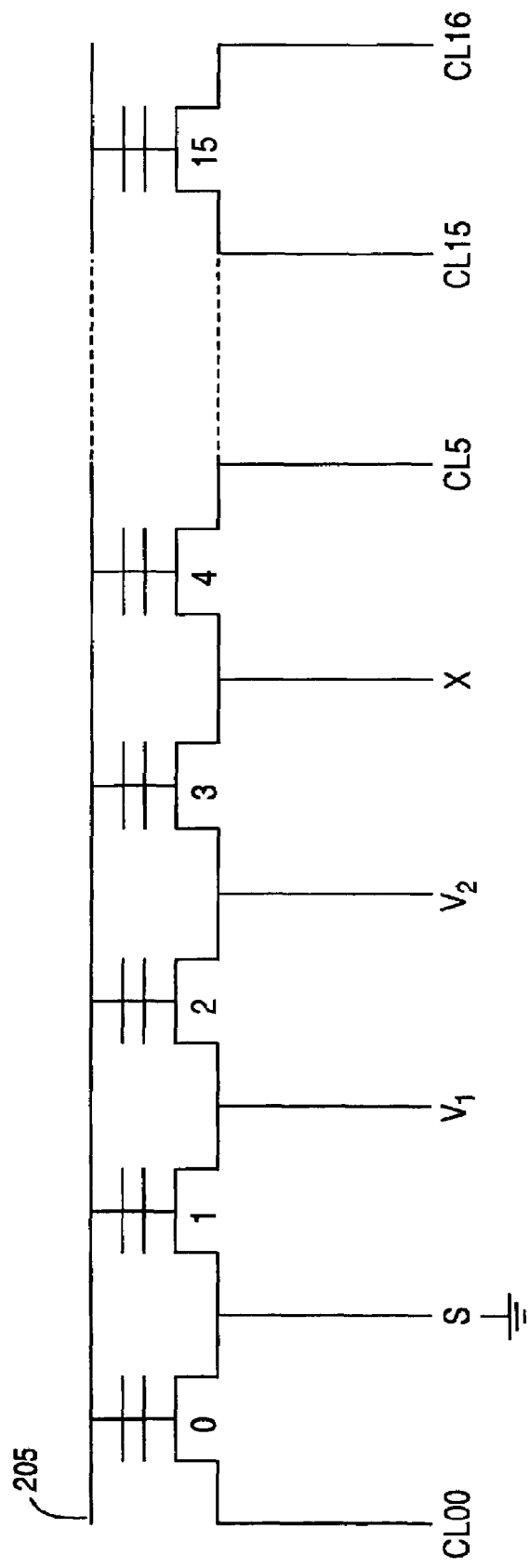
FIG. 3B shows a four column selection for a read operation in accordance with an embodiment of the present claimed invention.

FIG. 3B shows a four column selection and voltage source coupling for a read operation in accordance with an embodiment of the present claimed invention. For a read operation, $CLS_1$, of FIG. 3A is coupled to ground and $CLS_2$ is coupled to a voltage source $V_1$. $CLS_3$ is coupled to a voltage source $V_2$ and $CLS_4$ is allowed to float. Voltage source V1 is preferably in the range of 1.2 to 1.4 volts. Voltage source V2 has the same value as voltage source $V_1$ and is also preferably in the range of 1.2 to 1.4 volts. Typically, voltage source $V_1$ has an associated sense amplifier that enables measurement of the current from source $V_1$.

In one embodiment of the present invention, voltage source $V_1$ and voltage source $V_2$ are one and the same, with the current sensor being associated with the connection path to selected column line $CLS_2$. Thus, a single voltage source having two branches is used, with a current sensor being associated with one branch.

Since $V_2$ is applied to the column line adjacent to the column line to which $v_1$ is applied, with only one intervening memory cell (2), V2 is able to mask the parasitic elements associated with the remainder of the drain-source series of memory cells. The application of V2 in addition to V1 allows for rapid charging of parasitic capacitances, and thus reduces the time required to perform a read operation. Generally, during a read operation, the fourth selected column line $CLS_4$ is allowed to float. However, a further improvement in speed may be obtained by coupling $CLS_4$ to V2 in addition to $CLS_3$.

Figure 3C:
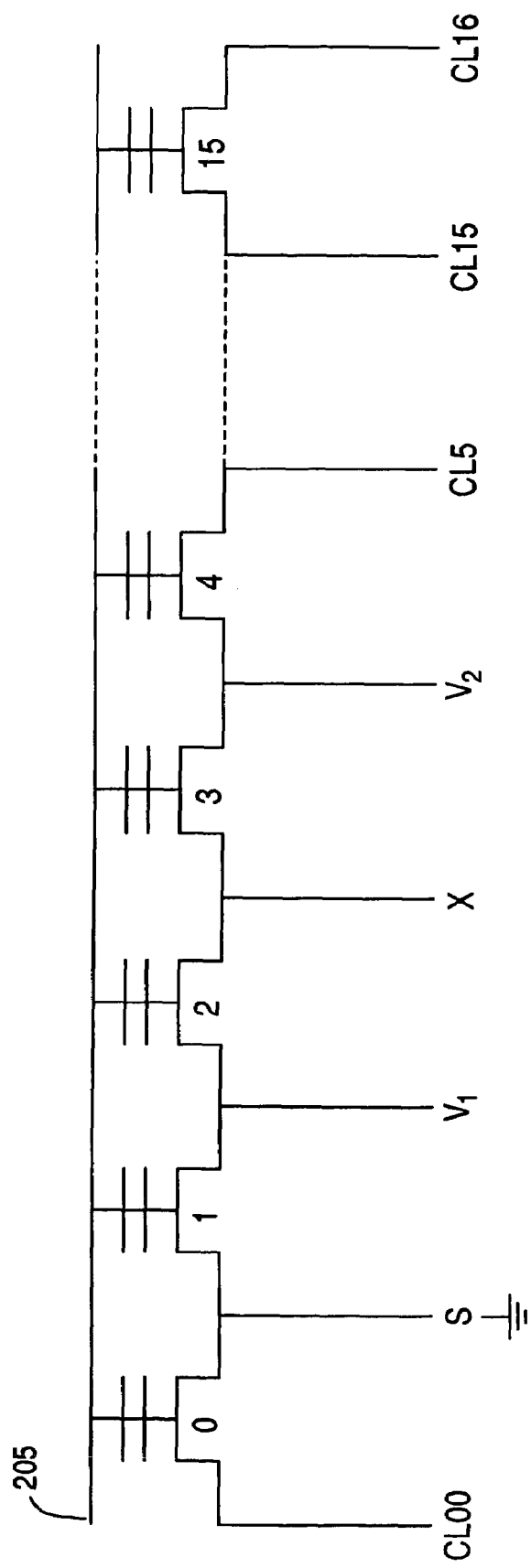
FIG. 3C shows a four column selection for a verify operation in accordance with an embodiment of the present claimed invention.

FIG. 3C shows a four column selection for a verify operation in accordance with an embodiment of the present claimed invention. For a verify operation, $CLS_1$ of FIG. 3A is coupled to ground and $CLS_2$ is coupled to a voltage source $V_1$. $CLS_4$ is coupled to a voltage source $V_2$ and $CLS_3$ is allowed to float. Voltage source V1 is preferably in the range of 1.2 to 1.4 volts. Voltage source V2 has the same value as voltage source $V_1$ and is also preferably in the range of 1.2 to 1.4 volts.

In contrast to the read operation previously described, for a verify operation, $V_1$ and $V_2$ are not applied to adjacent column lines. This is due to the greater emphasis on accuracy (as opposed to speed) for a verify operation. In practice there may be a small difference between the values of $V_1$ and $V_2$ that will produce a small steady state error current. For a read operation, such a current may be ignored since the transient error currents are the primary concern. By applying $V_2$ to $CLS_4$ and allowing $CLS_3$ to float, a greater effective resistance is obtained between $V_1$ and $V_2$, thereby reducing any error current that by be produced by a difference between $V_1$ and $V_2$.

Figure 4:
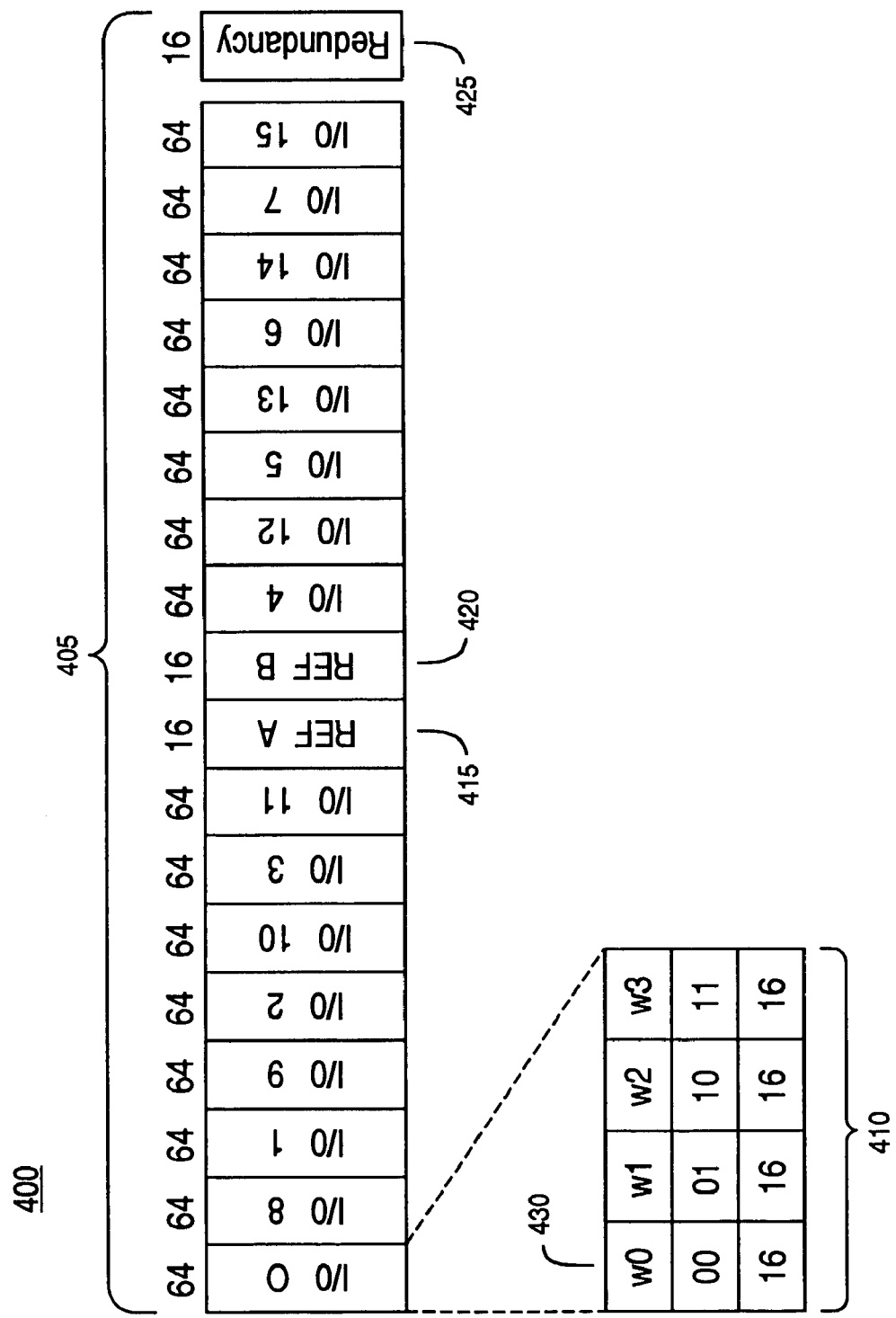
FIG. 4 shows a memory cell array sector layout with reference and redundancy blocks operation in accordance with an embodiment of the present claimed invention.

FIG. 4 shows an example of a memory cell array sector layout 400. A sector 405 comprises I/O blocks I/O0–I/O15 that form the core memory array, reference blocks 415 and 420, and a redundancy block 425. As shown, the redundancy block may be physically separate from the remainder of the sector. Each I/O block 410 comprises 4 sub-I/Os 430, each with a width of 16 cells. Each sub-I/0 (w0, w1, w2, w3) has an associated word number (00, 01, 10, 11). Thus, for a word length of 16 cells, each I/O block is four words (or 64 cells) wide. The reference blocks 415 and 420, and the Redundancy block 425 are each 16 cells wide. Thus, the basic unit of width for the sector 405 is 16 cells, and a common decoder structure with an addressable width of 16 cells may be used to address each block. The total number of decoders required is 67, with 64 decoders for the 16 I/O blocks I/O0–I/O15, 2 decoders for the reference blocks 415 and 420, and one decoder for the redundancy block 425. The sector 405 has an overall width of 1072 cells, and may have a height of about half of the width, e.g., 512 cells high.

Figure 5A:
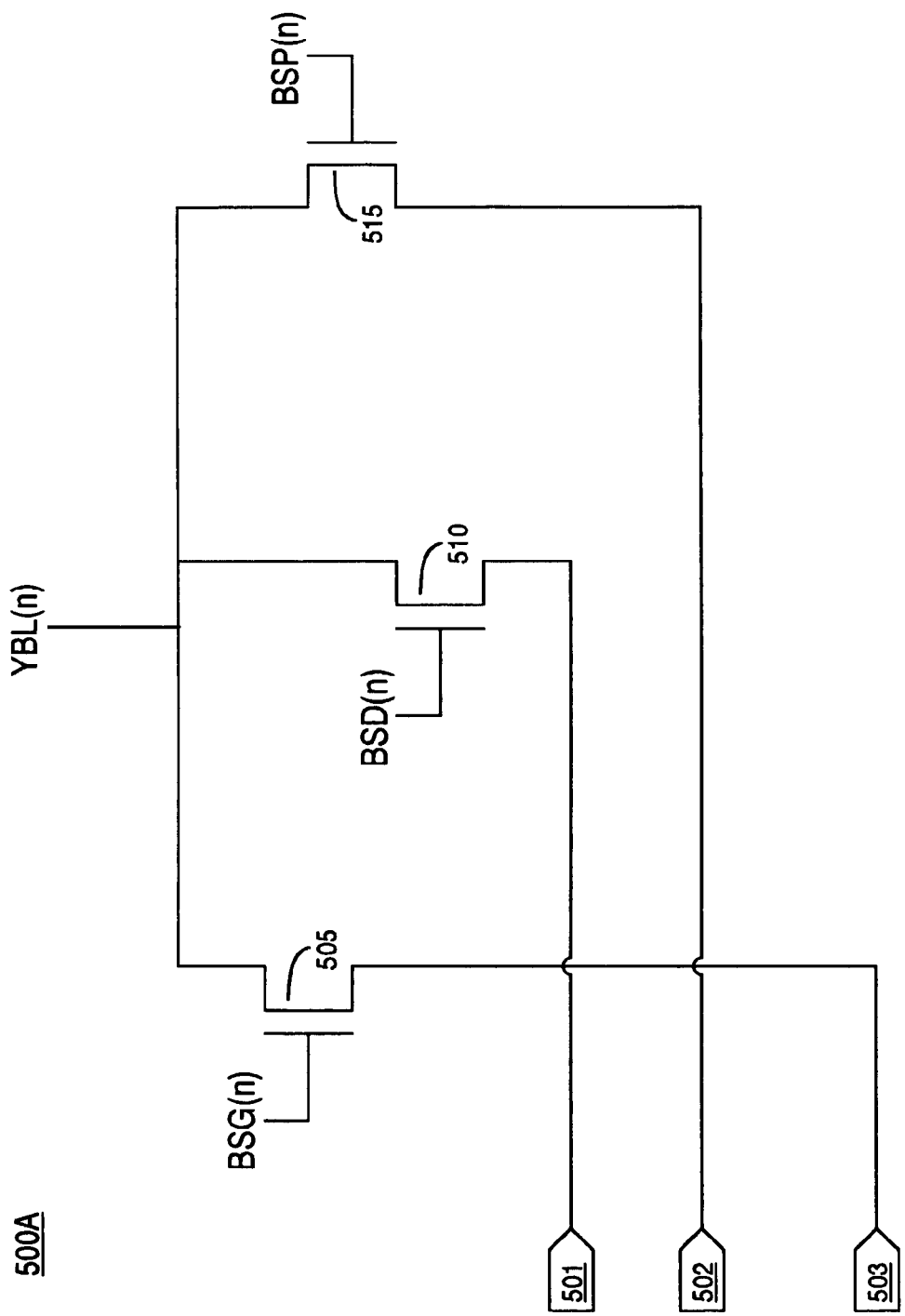
FIG. 5A shows a source selector for one column of a four column Y-decoder in accordance with an embodiment of the present invention.

FIG. 5A shows a source selector for one column of a four column Y-decoder in accordance with an embodiment of the present invention. A transistor switched ground 501 is controlled by an input BSG(n). When BSG(n) is asserted, the output YBL(n) of the selector is coupled to ground. A first voltage source 502 is controlled by an input BSD(n). When BSD(n) is asserted, the output YBL(n) is coupled to the first voltage source. A second voltage source 502 is controlled by an input BSP(n). When BSP(n) is asserted, the output YBL(n) is coupled to the second voltage source. When BSG(n), BSD(n), and BSP(n) are all low, the output YBL(n) is allowed to float.

Figure 5B:
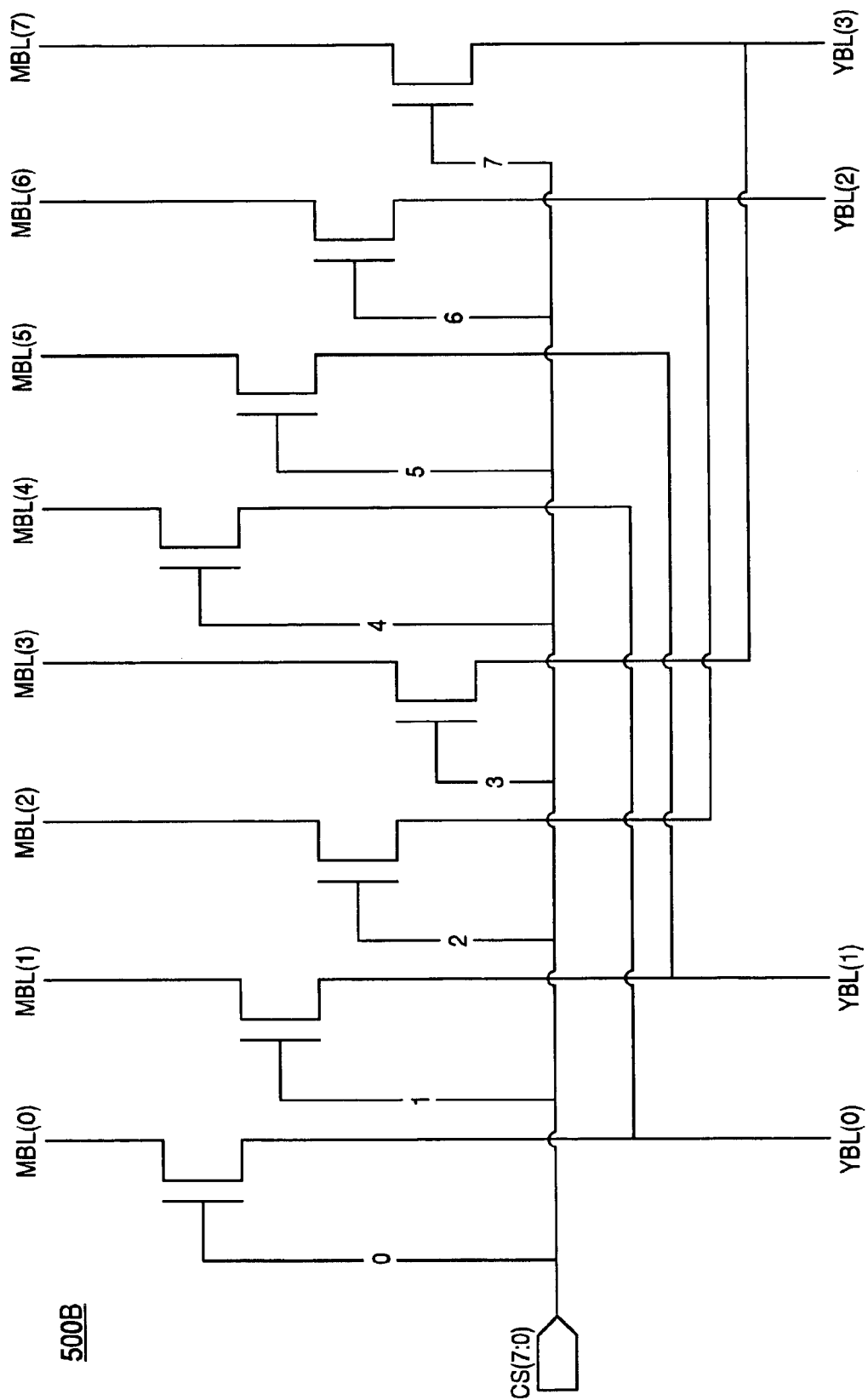
FIG. 5B shows a metal bit line selection portion of a four column Y-decoder in accordance with an embodiment of the present invention.

FIG. 5B shows a metal bit line selection portion of a four column Y-decoder in accordance with an embodiment of the present invention. YBL(0), YBL(1), YBL(2), and YBL(3) are coupled to the output of a source selector YBL(n) as shown in FIG. 5A, and branch into two switched metal bit line legs that are controlled by selector CS(7:0). Eight metal bit lines MBL(0)–MBL(7) are controlled by the selector CS(7:0).

Figure 5C:
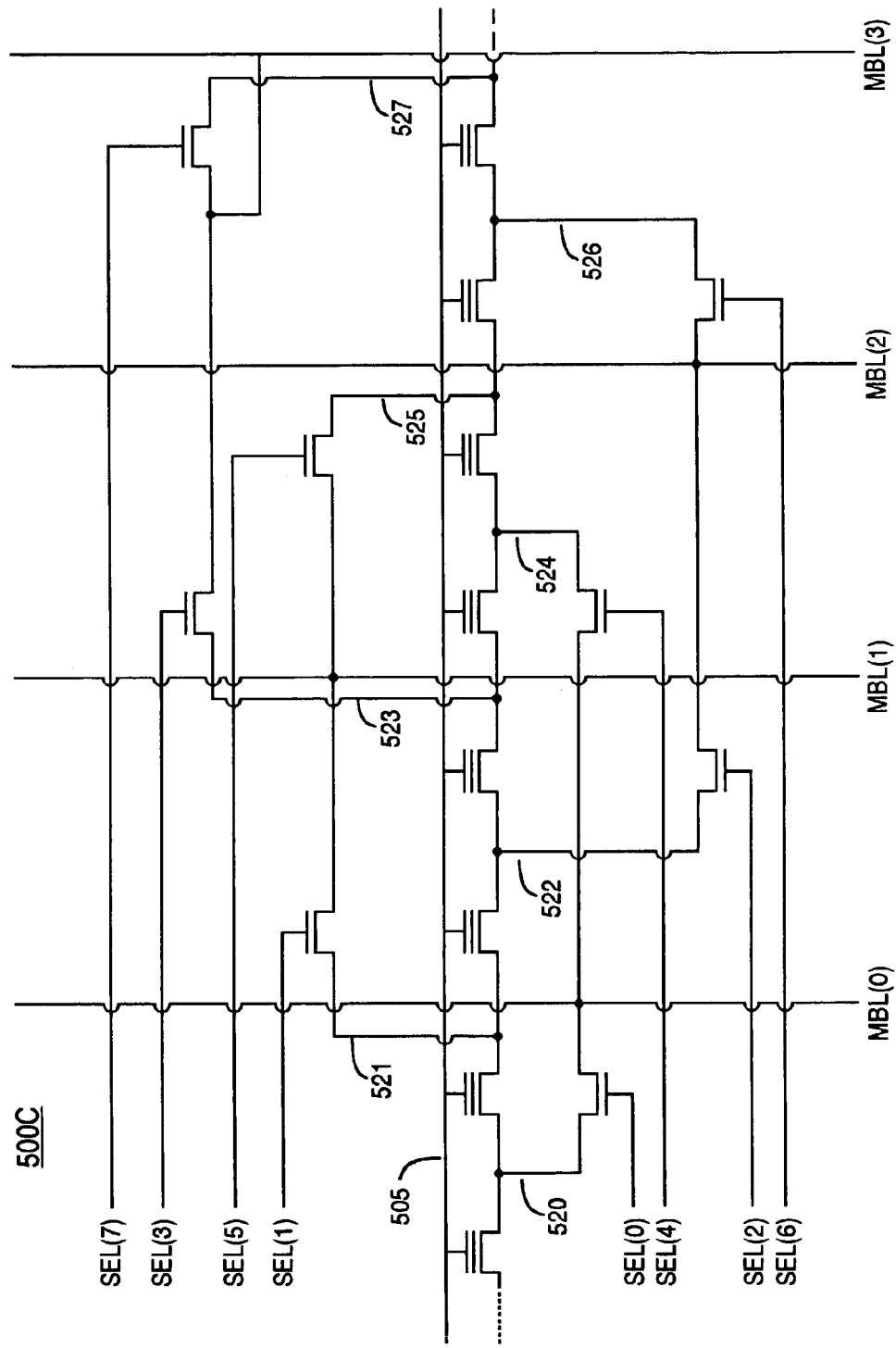
FIG. 5C shows a diffusion bit line selection portion of a four column Y-decoder in accordance with an embodiment of the present invention.

FIG. 5C shows a diffusion bit line selection portion of a four column Y-decoder in accordance with an embodiment of the present invention. This portion is coupled to one half of the outputs of FIG. 5B, with a similar portion being coupled to the other half. Each of the metal bit lines MBL(0)–MBL(3) is terminated by two switched diffusion bit lines and is coupled to a drain-source node on the drain source series 505. Each of inputs SEL(0)–SEL(7) controls diffusion bit lines (column lines) 520–527. The combination of the components shown in FIGS. 5A, 5B, and 5C provide a four-column Y-decoder that may be used to select four columns out of a sub I/O that is 16 memory cells wide.

Figure 6:
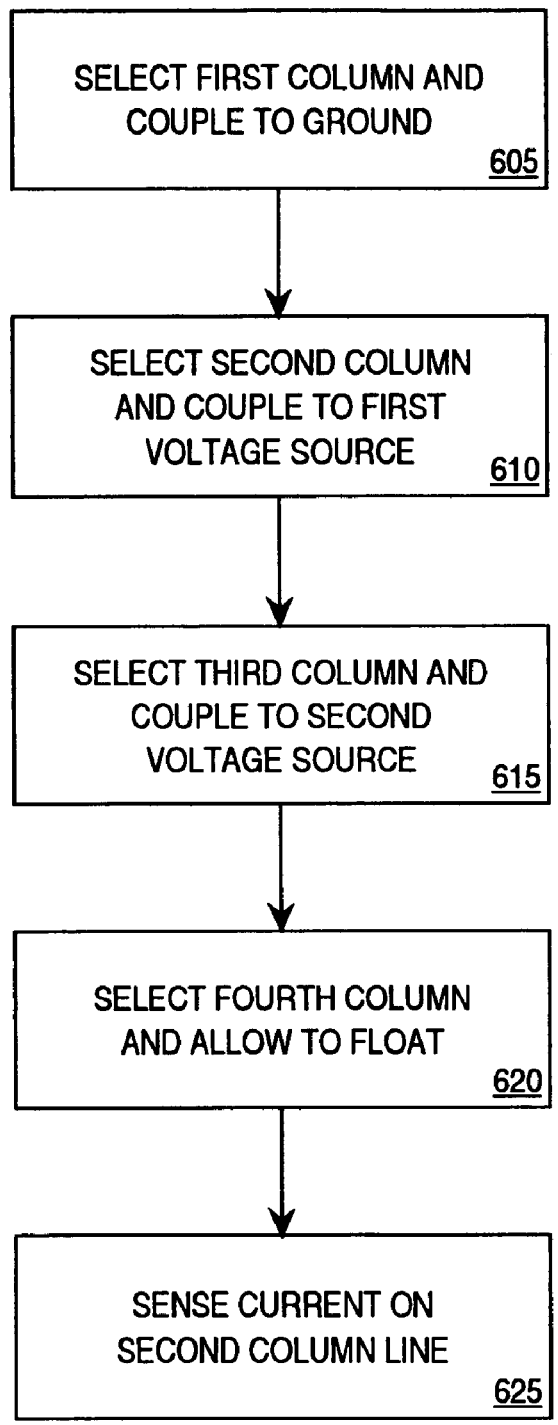
FIG. 6 shows a flowchart diagram for four column sense operation in accordance with an embodiment of the present claimed invention.

FIG. 6 shows a flowchart diagram for four column sense operation performed on a drain-source series of memory cells in accordance with an embodiment of the present claimed invention. In step 605, a first column line associated with a memory cell is selected and coupled to ground. This column line is generally the source of the memory cell. In step 610 a second column line is selected and coupled to a first voltage source. The second column line is generally coupled to the drain of the memory cell. In step 615, a third column line is selected and coupled to a second voltage source, and may or may not be adjacent to the second column line. In step 620, a fourth column line is selected and allowed to float. The fourth column line may or may not be adjacent to the second column line. For a read operation it is preferred that the third column line be adjacent to the second column line, and for a verify operation it is preferred that the fourth column line be adjacent to the second column line. In step 625, the current from the first voltage source is sensed.

While the present invention of a system and method for Y-decoding has been described in particular embodiments, it should be appreciated that the present invention should not be construed as limited by such embodiments, but rather construed according to the below claims.

What is claimed is:

1. A non-volatile memory device comprising:
   a plurality of nonvolatile memory cells arranged in a rectangular memory array having rows and columns, each said memory cell comprising a gate, a source, and a drain, wherein said memory cells are configured as a drain-source series wherein, within each said row said sources and said drains or each said memory cell are coupled to form a linear chain having a plurality of drain-source nodes, wherein each of said plurality of non-volatile memory cells comprises a uniform symmetric structure capable of storing two bits and wherein said plurality of memory cells are configured serially to form a NOR-AND (NAND) memory array or in parallel to form a NOR memory array, wherein a common word line is coupled to each said gate of said row;
   a plurality of column lines including at least a first, second, third, and fourth column line, wherein each column line is coupled a drain source node;
   logic for selecting a first column line from said plurality of column lines, and for coupling the selected first column line to ground;
   logic for selecting a second column line from said plurality of column lines, and for coupling a first voltage source to the selected second column line;
   logic for selecting a third column line from said plurality of column lines, and for coupling a second voltage source to the selected third column line, wherein said second voltage source and said first voltage source each comprise voltages that have substantially the same value and wherein said second voltage value effectively screens said first voltage source from parasitic resistances and from parasitic capacitances associated with said memory array; and logic for selecting a fourth column line, and for allowing the selected fourth column line to float, wherein said selecting logic comprises a four column Y decoder.

2. The non-volatile memory device of claim 1, wherein said first voltage source and said second voltage source have a voltage in the range of 1.2 to 1.4 volts.

3. The non-volatile memory device of claim 1, wherein the selected first column line is adjacent to the selected second column line, the selected third column line is adjacent to the second selected column line, and also adjacent to the selected fourth column line.

4. The method of claim 1, wherein said first voltage source and said second voltage source are the same.

5. A method for performing a sensing operation on the state of a non-volatile memory cell belonging to a plurality of nonvolatile memory cells configured as a drain-source series, said method comprising:

selecting a first column line and coupling said first column line to ground, wherein each of said plurality of non-volatile memory cells comprises a uniform symmetric structure capable of storing two bits, each comprising a gate, a source, and a drain, and wherein said memory cells are configured as a drain-source series having a plurality of drain-source nodes and wherein said plurality of memory cells are arranged in a rectangular memory array having rows and columns and configured serially to form a NOR-AND (NAND) memory array or in parallel to form a NOR memory array and wherein, within each said row said sources and said drains or each said memory cell are coupled to form a linear chain, wherein a common word line is coupled to each said gate of said row;

selecting a second column line adjacent to said first column line and coupling said second column line to a first voltage source;

selecting a third column line and coupling said third column line to a second voltage source, wherein said second voltage source and said first voltage source each comprise voltages that have substantially the same value and wherein said second voltage value effectively screens said first voltage source from parasitic resistances and from parasitic capacitances associated with said memory array;

selecting a fourth column line and allowing said fourth column line to float, wherein said selecting is performed with a four column Y decoder; and sensing a current supplied by said first voltage source.

6. The method of claim 5, wherein said first voltage source and said second voltage source have a voltage in the range of 1.2 to 1.4 volts.

7. The method of claim 5, wherein the selected first column line is adjacent to the selected second column line, the selected third column line is adjacent to the second selected column line and also adjacent to the selected fourth column line.

8. The method of claim 5, wherein said sensing operation is a read operation.

9. The method of claim 5, wherein said sensing operation is a verify operation.

10. The method of claim 5, wherein said first voltage source and said second voltage source are the same.

* * * * *

UNITED STATES PATENT AND TRADEMARK OFFICE
CERTIFICATE OF CORRECTION

| | | |
|---|---|---|
| PATENT NO. | : 7,142,454 B2 | Page 1 of 1 |
| APPLICATION NO. | : 10/243315 | |
| DATED | : November 28, 2006 | |
| INVENTOR(S) | : Tien-Chun Yang et al. | |

It is certified that error appears in the above-identified patent and that said Letters Patent is hereby corrected as shown below:

Title Page, Item (73)
Correct Assignee name as follows:

(73) Assignee: Spansion LLC

Signed and Sealed this

Thirteenth Day of February, 2007

JON W. DUDAS
*Director of the United States Patent and Trademark Office*